United States Patent
Maeda et al.

(10) Patent No.: US 6,762,488 B2
(45) Date of Patent: Jul. 13, 2004

(54) LIGHT THIN STACKED PACKAGE SEMICONDUCTOR DEVICE AND PROCESS FOR FABRICATION THEREOF

(75) Inventors: Takehiko Maeda, Kanagawa (JP); Jun Tsukano, Kanagawa (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/382,838

(22) Filed: Mar. 7, 2003

(65) Prior Publication Data

US 2003/0178716 A1 Sep. 25, 2003

(30) Foreign Application Priority Data

Mar. 19, 2002 (JP) .................................. 2002-076114

(51) Int. Cl.⁷ .............................................. H01L 23/02
(52) U.S. Cl. ..................................... 257/686; 257/777
(58) Field of Search ............................. 257/686, 777, 257/778, 723

(56) References Cited

U.S. PATENT DOCUMENTS 5,903,049 A * 5/1999 Mori .......................... 257/686
2003/0141583 A1 * 7/2003 Yang .......................... 257/686

* cited by examiner

Primary Examiner—Phat X. Cao

(57) ABSTRACT

A stacked package semiconductor device includes a semiconductor chip package, which has been reduced in thickness through a polishing after being sealed in a resin package, and a semiconductor flip chip electrically connected to the semiconductor chip package through conductive bumps embedded in an underfill resin layer below the semiconductor flip chip; the semiconductor chip package is stacked with the semiconductor flip chip, and the semiconductor flip chip is reduced in thickness through the polishing after the resultant structure is molded in a synthetic resin package; although the semiconductor chip package and semiconductor flip chip are reduced in thickness, the polishing is carried out after the semiconductor chip are sealed in the resin so that the semiconductor chips are less broken during the polishing.

18 Claims, 12 Drawing Sheets

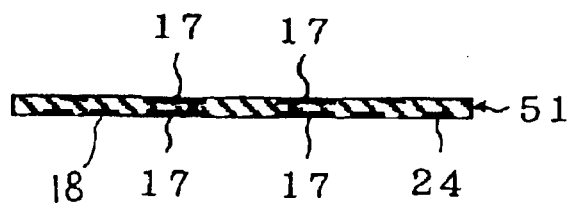
Fig. 1 2 A
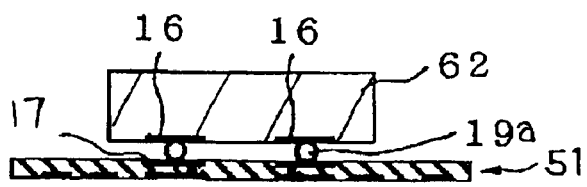
Fig. 1 2 B
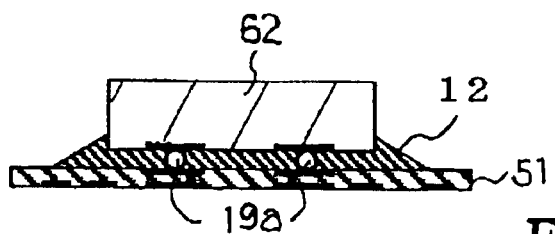
Fig. 1 2 C
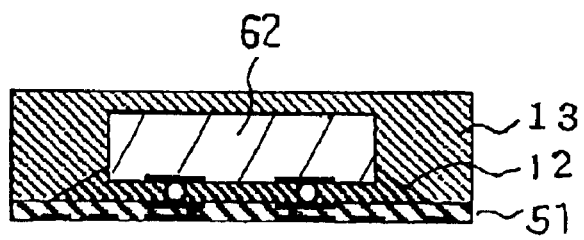
Fig. 1 2 D
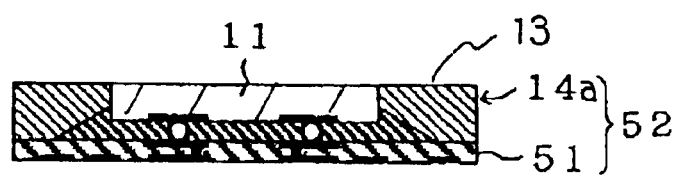
Fig. 1 2 E

LIGHT THIN STACKED PACKAGE SEMICONDUCTOR DEVICE AND PROCESS FOR FABRICATION THEREOF

FIELD OF THE INVENTION

This invention relates to a semiconductor device and a fabrication process thereof and, more particularly, to a semiconductor device having stacked semiconductor chips sealed in a package and a process for fabrication thereof.

DESCRIPTION OF THE RELATED ART

A standard semiconductor device has a single semiconductor chip sealed in a package. The standard semiconductor devices are mounted on a printed circuit board, and form a module. However, the standard semiconductor devices occupy wide area on the printed circuit board. This results in large electronic goods.

In order to scale down the electronic devices, the manufacturers are to make the printed circuit boards narrow and light. One of the approaches is to stack plural semiconductor chips with one another in a single semiconductor chip. The semiconductor device with stacked semiconductor chips is called as "stacked package semiconductor device". The stacked package semiconductor devices are conducive to small electronic goods. Especially, the stacked package semiconductor devices are preferable for portable electronic goods such as, for example, handy phones and PDAs (Personal Digital Assistants).

FIG. 1 shows a typical example of the stacked package semiconductor device, which is disclosed in Japanese Patent Application laid-open No. 2001-223326. Reference numeral 1 designates the prior art stacked package semiconductor device. The prior art stacked package semiconductor device comprises a primary semiconductor flip chip 2 and a secondary flip chip 4. The primary flip chip 2 is mounted on a printed flexible tape 3, and the secondary flip chip 4 is mounted on a printed film 5. A conductive pattern is printed on the printed flexible tape 3, and the primary flip chip 2 is connected at pads thereof to the conductive pattern. Similarly, a conductive pattern is formed on the film 5, and the pads of the secondary flip chip 4 are connected to the conductive pattern. The printed film 5 is adhered to the primary flip chip 2 so that the primary flip chip 2 is stacked with the secondary flip chip 4.

The conductive pattern on the film 5 has electrodes 5a, and the conductive pattern on the tape 3 also has electrodes 3b. The electrodes 5a are connected to the electrodes 3b through conductive wires 6, and solder balls 7 are connected to the conductive pattern, which includes the electrodes 3b, through the via holes formed in the flexible tape 3. The primary flip chip 2 on the printed tape 3, secondary flip chip 4 on the printed film 5 and conductive wires 6 are sealed in a piece of synthetic resin. Thus, the prior art stacked package semiconductor device 1, which includes the primary and secondary flip chips 2/4, occupies narrower than the total area to be occupied by the individual flip chips 2 and 4.

Although the prior art stacked package semiconductor device is conducive to the reduction in occupation area, the prior art stacked package semiconductor device requires the printed films 3/5 for the individual flip chips 2/4. The printed tape 3 and printed film 5 are so thick that the prior art stacked package semiconductor device is thick and heavy. If the prior art stacked package semiconductor devices are incorporated in desk-top type electronic goods, the thickness and weight may not be a problem. However, the weight and thickness of the prior art stacked package semiconductor device are serious in the portable electronic goods.

SUMMARY OF THE INVENTION

It is therefore an important object of the present invention to provide a stacked package semiconductor device, which is reduced in weight and thickness.

It is also an important object of the present invention to provide a process for fabricating the light thin stacked package semiconductor device.

In accordance with one aspect of the present invention, there is provided a stacked package semiconductor device comprising a semiconductor chip package including a sealing package made of a certain material and a semiconductor chip made of a semiconductor material brittler than the certain material, provided with a first group of conductive pads on a first surface thereof, sealed in the sealing package and having a second surface reverse to the first surface and exposed to the outside of the sealing package, a semiconductor element provided over the semiconductor chip and having a second group of conductive pads on a certain surface thereof, a connector electrically connected between certain conductive pads selected from the first group and corresponding conductive pads of the second group and buried in a piece of synthetic resin held in contact with the semiconductor chip package and the semiconductor element, a package in which the semiconductor chip package, the semiconductor element and the connector are sealed, and an array of external terminals electrically connected to remaining conductive pads of the first group and remaining conductive pads of the second group.

In accordance with another aspect of the present invention, there is provided a process for fabricating a stacked package semiconductor device comprising the steps of a) preparing a precursor of a semiconductor chip package including a sealing package made of a certain material and a semiconductor chip sealed in the sealing package and made of a semiconductor material brittler than the certain material, b) polishing the sealing package and the semiconductor chip for exposing a surface of the semiconductor chip to the outside of the sealing package so that the semiconductor chip package is made from the precursor, c) stacking the semiconductor chip package with a semiconductor element electrically connected to the semiconductor chip package and d) forming the semiconductor chip package and the semiconductor element into a stacked package semiconductor device.

In accordance with yet another aspect of the present invention, there is provided a semiconductor stacked package device comprising a semiconductor chip package including a sealing package formed with a hollow space, a semiconductor chip sealed in the sealing package and having conductive pads of a first group on a first surface exposed to the hollow space and a connector formed in the hollow space and having a conductive pattern exposed to the outside of the sealing package and conductive pieces selectively connected between the conductive pads of the first group and the conductive pattern, a semiconductor element stacked on the semiconductor chip package and having conductive pads of a second group selectively connected to the conductive pattern by means of other conductive pieces, an array of external terminals selectively electrically connected to the conductive pads of the first group and the conductive pads of the second group and a synthetic resin package in which the semiconductor chip package and the semiconductor element are sealed, and the array of external terminals is exposed to the outside of the synthetic resin package.

BRIEF DESCRIPTION OF THE DRAWINGS

The features and advantages of the stacked package semiconductor device and process will be more clearly understood from the following description taken in conjunction with the accompanying drawings, in which FIGS. 12A to 12E are cross sectional views showing a process for fabricating a semiconductor package.

DESCRIPTION OF THE PREFERRED EMBODIMENTS

First Embodiment

Figure 2:
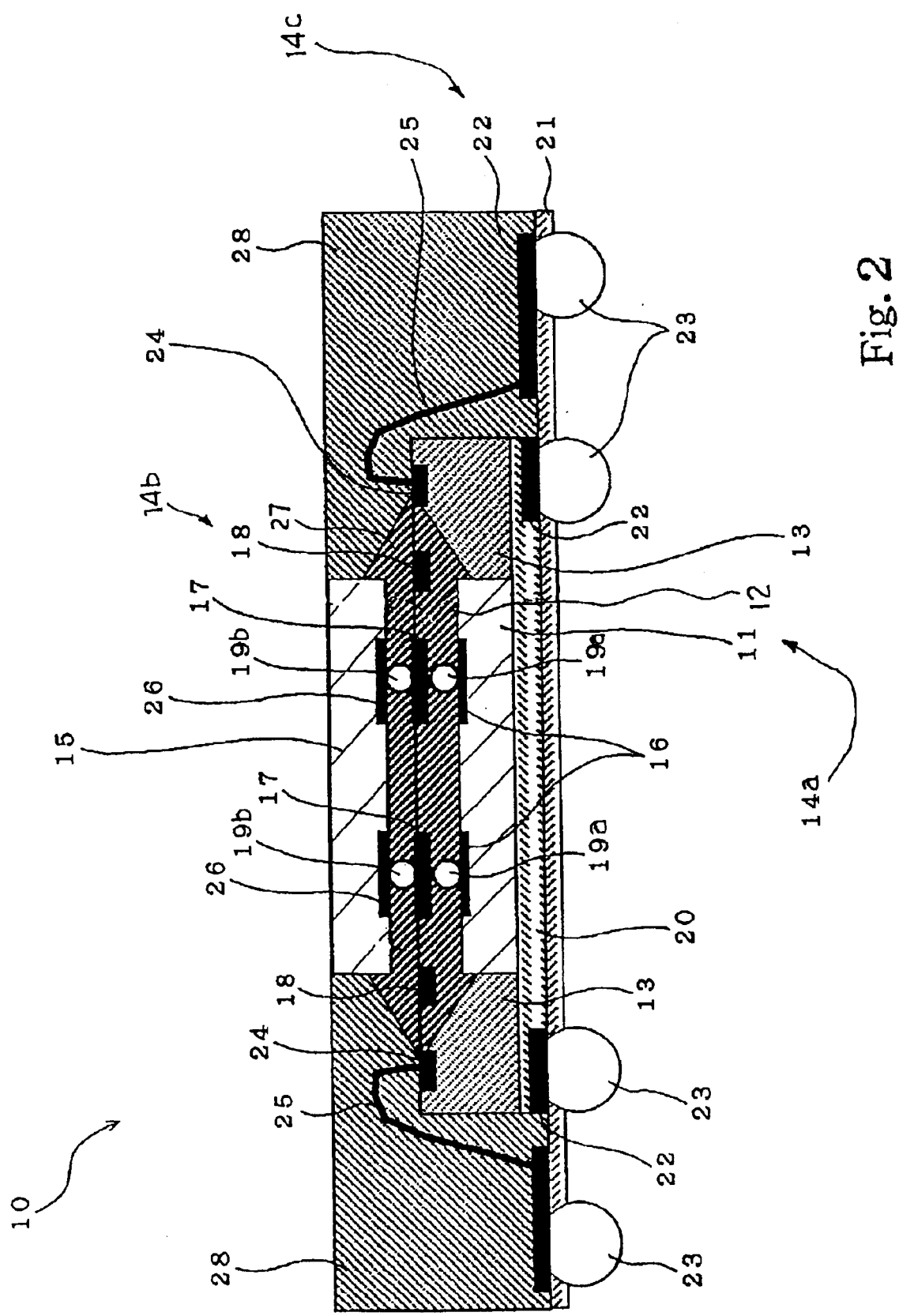
FIG. 2 is a cross sectional view showing the structure of a stacked package semiconductor device according to the present invention.

Referring to FIG. 2 of the drawings, a stacked package semiconductor device 10 embodying the present invention largely comprises a semiconductor chip package 14a, a semiconductor flip chip 15, an inter-level connector 14b, a ball grid array 14c, a conductive wires 25 and a synthetic resin package 28. The semiconductor chip package 14a is adhered to the ball grid array 14c through an adhesive compound layer 20, and signals and power voltages are supplied through conductive balls 23 to a semiconductor flip chip 11 incorporated in the semiconductor chip package 14a. The power voltages and other signals are supplied through the conductive balls 23, conductive wires 25, a conductive pattern 24 on the top surface of the sealing package 13 and the inter-level connector 14b to the semiconductor chip 15. In this instance, the conductive wires 25 are made of gold. The semiconductor flip chip 15 is turned over so that conductive pads 26 are directed downwardly. The semiconductor flip chip 11 has a conductive pattern 17, which is electrically connected through the inter-level connector 14b to the conductive pads 26 of the semiconductor flip chip 15. Thus, the semiconductor chip 15 is electrically connected through the inter-level connector 14b to the semiconductor chip 11 and through the inter-level connector 14b and conductive wires 25 to the ball grid array 14c. The semiconductor chip package 14a, inter-level connector 14b, semiconductor chip 15, and conductive wires 25 are sealed in the synthetic resin package 28. The conductive pattern 17 includes plural conductive strips electrically isolated from one another, and the conductive pattern 24 also has plural conductive strips electrically isolated from one another.

The semiconductor chip package 14a includes the semiconductor flip chip 11, an underfill resin layer 12, a sealing package 13 of synthetic resin, conductive patterns 17/18/24 and conductive bumps 19a. The semiconductor flip chip 11 is buried in the sealing package 13. Nevertheless, the sealing package 13 is formed with a recess, and the conductive pads 16, which are arranged on the upper surface of the semiconductor flip chip 11, are exposed to the recess as shown. The sealing package 13 is made of epoxy resin for semiconductor usage, and the epoxy resin has the glass transition temperature at 150 degrees in centigrade. The sealing package 13 has mechanical strength large enough to keep the conductive pattern 24 stable during and after the wire bonding.

The underfill resin layer 12 fills the recess formed in the synthetic resin package 13, and the conductive patterns 17/18 and conductive bumps 19a are embedded in the underfill resin layer 12. The conductive pattern 17 is used for interconnections to the semiconductor flip chip 15, and the conductive pattern 18 is used for a testing, i.e., a diagnosis on the semiconductor flip chip 11. The conductive patterns 17/18 are exposed to one of the major surfaces of the underfill resin layer 12, which is substantially coplanar with the upper surface of the semiconductor chip package 14. The conductive bumps 19a are held in contact with the conductive pattern 17, and are exposed to the other major surface of the underfill resin layer 12. The conductive bumps 19a are aligned with conductive pads 16 of the semiconductor flip chip 11. Thus, the conductive pattern 17 is electrically connected through the conductive bumps 19a to the conductive pads 16, which in turn are electrically connected to an integrated circuit in the semiconductor flip chip 11. The underfill resin layer 12 fixes the conductive bumps 19a to the conductive pads 16 and the conductive pattern 17, and prevents the semiconductor flip chip 11 from contaminants and mechanical damages.

The semiconductor chip package 14a is stacked with the semiconductor chip 15 by means of the inter-level connector 14b. The inter-level connector 14b includes an underfill resin layer 27 and conductive bumps 19b.

The underfill resin layer 12 is overlaid with the other underfill resin layer 27, and the conductive bumps 19b, which are buried in the other underfill resin layer 27, offer signal paths between the conductive pattern 17 and the conductive pads 26 on the semiconductor flip chip 15. The conductive pads 26 and lower surface of the semiconductor flip chip 15 are covered with the underfill resin layer 27. The underfill resin layer 27 is tightly adhered to the underfill resin layer 12, and prevents the semiconductor flip chip 15 from contaminants and mechanical damages.

The ball grid array 14c includes a solder resist layer 21, a conductive wiring pattern 22 and the conductive balls 23. The semiconductor chip package 14a is adhered to a central area on the top surface of the solder resist layer 21 through the adhesive layer 20, and the conductive pattern 22 is formed in a peripheral area on the top surface of the solder resist layer 21. The conductive balls 23 are partially embedded in the solder resist layer 21, and project from the reverse surface of the solder resist layer 21. The conductive pattern 22 includes plural conductive strips.

The synthetic resin package 28 is made of the epoxy resin for semiconductor usage, and is adhered to the solder resin layer 21. Although the semiconductor chip package 14a, inter-level connector 14b, conductive pattern 22, conductive wires 25 and semiconductor flip chip 15 are sealed in the synthetic resin package 28, the reverse surface of the second semiconductor flip chip 15 is exposed to the upper surface of the synthetic resin package 28.

The semiconductor flip chip 11 is embedded in the sealing package 13, and the underfill resin layer 12 reinforces the semiconductor flip chip 11. Thus, the sealing package 13 and underfill resin layer 12 prevent the semiconductor flip chip 11 from the mechanical damages, and the semiconductor flip chip 11 is less liable to be broken during the assembling work. For this reason, the manufacturer can make the semiconductor flip chip 11 extremely thin. This results in the light and thin stacked package semiconductor device 10.

Similarly, the semiconductor flip chip 15 is supported by the synthetic resin package 28, and is reinforced by the underfill resin layer 27. The semiconductor flip chip 15 is less liable to be broken. For this reason, the manufacturer can reduce the semiconductor flip chip 15 as thin as possible.

Moreover, the underfill resin layers 12/27 are directly held in contact with one another. In other words, the underfill resin layer 12 per se is adhered to the other underfill resin layer 27 without any adhesive compound layer. The gap between the semiconductor flip chips 11 and 15 is as narrow as the conductive bumps 19a/19b and the conductive pattern 17. For this reason, the inter-level connector 14b is thinner than the total thickness of the printed film 5 and adhesive layers on both surfaces thereof. This results in that the stacked package semiconductor device 10 is thinner than and lighter than the prior art stacked package semiconductor device.

Description is hereinafter described on a process for fabricating the stacked package semiconductor device 10 according to the present invention with reference to FIGS. 3A to 3F and 4A to 4H.

Figure 3:
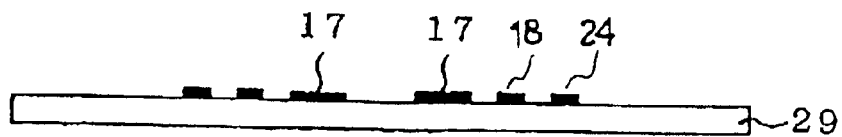
FIGS. 3A to 3F are cross sectional views showing a process for fabricating a semiconductor chip package according to the present invention.
Figure 3:
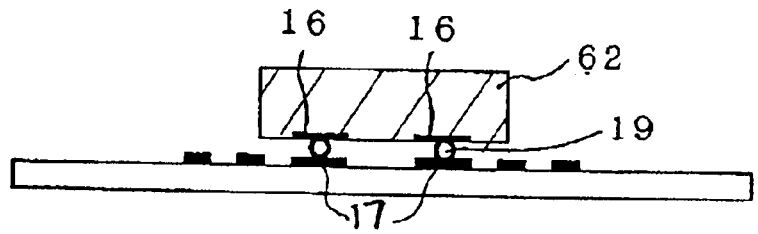
Figure 3:
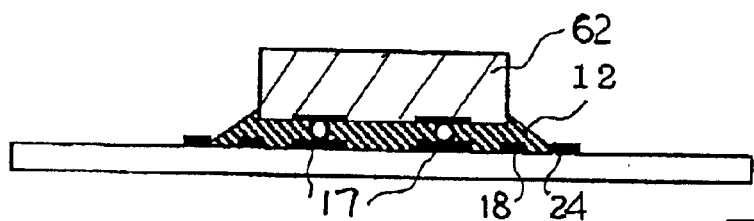
Figure 3:
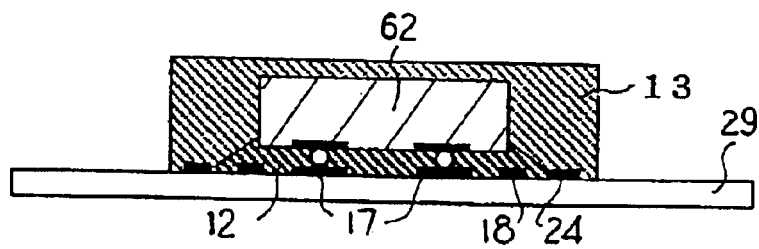
Figure 3:
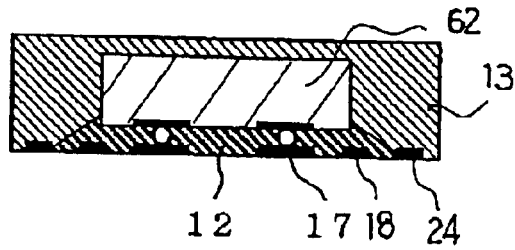
Figure 3:
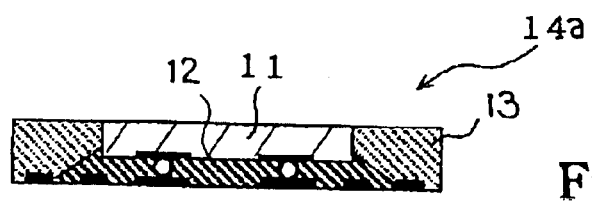

The semiconductor chip package 14a is fabricated as follows. First, a copper substrate 29 is prepared. On the major surface of the copper substrate 29, a gold layer, a nickel layer, a copper layer, a nickel layer and a gold layer Au are deposited over the major surface of the copper substrate 29 through electroplating techniques, and the nickel layer and gold layer are patterned into the conductive patterns 17/18/24 as shown in FIG. 3A. The gold layer is fallen within the range between 0.01 micron to several microns, the nickel layer is 1 micron thick to several microns thick, and the copper layer is several microns thick to tens microns thick.

Subsequently, a semiconductor flip chip 62 is mounted on the conductive pattern 17 through flip chip bonding techniques. Though not shown in the drawings, the copper substrate 29 is shared with other semiconductor flip chips 62, and the other semiconductor flip chips 62 are also mounted on their conductive patterns 17. The conductive bumps 19 are provided between the conductive pattern 17 and the conductive pads 16 of the semiconductor flip chip 62 as shown in FIG. 3B.

Subsequently, synthetic resin is injected into the gap between the semiconductor flip chip 62 and the copper substrate 29. The synthetic resin fills the gap between the semiconductor flip chip 62 and the copper substrate 29, and is spread around the semiconductor flip chip 62. The synthetic resin is thermally cured so that the conductive pads 16, conductive bumps 19 and conductive pattern 17 are buried in the underfill resin layer 12 as shown in FIG. 3C.

Subsequently, the semiconductor flip chip 62 on the copper substrate 29 is conveyed to a molding machine (not shown), and the semiconductor flip chip 62, conductive patterns 17/18/24 and underfill resin layer 12 are sealed in the synthetic resin package 13 through a transfer molding technique. The synthetic resin is thermally cured as shown in FIG. 3D Subsequently, the copper substrate 29 is etched away so that the conductive patterns 17/18/24 are left in the underfill resin layer 12 as shown in FIG. 3E. Upon completion of the etching, the synthetic resin package 13 and semiconductor flip chip 62 are polished so that the thin semiconductor chip package 14a is completed as shown in FIG. 3F. A chemical mechanical polishing technique may be used for reduction in thickness. The semiconductor chip package 14a has the thickness ranging from 10 microns to 150 microns. The semiconductor chip package 14a is separated from the other semiconductor chip packages.

Thus, the semiconductor chip package 14a is obtained through the process described with reference to FIGS. 3A to 3F. The polishing step is preferable from the viewpoint of reduction in thickness of the stack package semiconductor device 10. The semiconductor flip chip 11 has been already reinforced by means of the sealing package 13 and underfill resin layer 12a. The semiconductor flip chip 11 well withstands the mechanical force during the polishing.

The stacked package semiconductor device 10 is fabricated through a process sequence shown in FIGS. 4A to 4H. The process for fabricating the semiconductor chip package 14a may be partially overlapped with the process shown in FIGS. 4A to 4H.

Figure 4A:
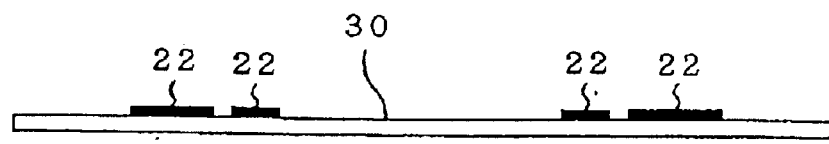
FIGS. 4A to 4H are cross sectional views showing a process for fabricating the stacked package semiconductor device according to the present invention.

The process starts with preparation of a frame 30. The frame 30 is made of copper alloy. Gold, nickel, copper, nickel and gold are successively deposited over the major surface of the frame 30 by using the electroplating techniques. The gold layer, nickel layer, copper layer, nickel layer and gold layer form the conductive pattern 22 as shown in FIG. 4A. The gold layer is 0.01 micron thick to several microns thick, nickel layer ranges from 1 micron thick to several microns thick, and copper layer is fallen within the range between several microns thick and tends microns thick.

Figure 4B:
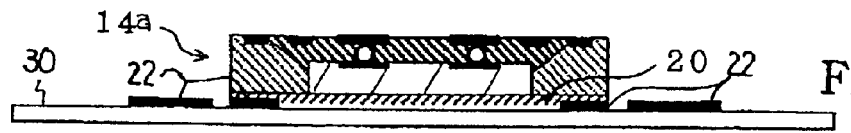

Subsequently, the semiconductor chip package 14a is mounted on the frame 30 by using a die bonding technique, and adhesive compound paste or a piece of adhesive compound foil makes the semiconductor chip package 14a fixed to the conductive pattern 22. The adhesive compound paste or piece of adhesive compound foil is thermally cured after the mounting. Thus, the semiconductor chip package 14a is secured to the conductive pattern 22 on the frame 30 as shown in FIG. 4B. Although plural semiconductor chip packages 14a are mounted on the frame 30, only one semiconductor chip package 14a is shown in FIGS. 4A to 4H, and description is focused on the semiconductor chip package 14a.

Figure 4C:
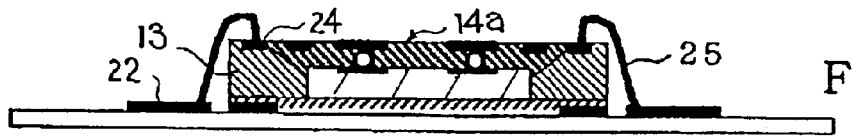

Subsequently, the conductive pattern 22 on the frame 30 is connected to the conductive pattern 24 on the sealing package 13 by using a wire bonding technique. The conductive wires 25 offer conductive paths to the signals and electric powers as shown in FIG. 4C.

Figure 4D:
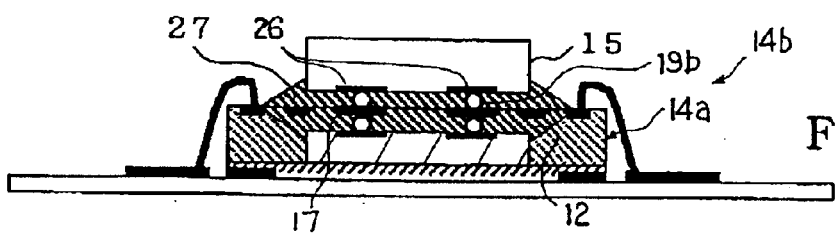

Subsequently, the conductive pads 26 of the semiconductor flip chip 15 are aligned with the conductive pattern 17 embedded in the underfill resin layer 12, and the semiconductor flip chip 15 is bonded through the conductive bumps 19b to the conductive pattern 17 by using the flip chip bonding technique. The synthetic resin is injected into the gap between the semiconductor chip package 14a and the semiconductor flip chip 15. The synthetic resin fills the gap, and is spread around the semiconductor flip chip 15. The synthetic resin is thermally cured so that the semiconductor chip package 14a is stacked with the semiconductor flip chip 15 as shown in FIG. 4D. In another process sequence, the injection of synthetic resin is carried out prior to the flip chip bonding. The underfill resin layers 12/27 and conductive bumps 19a/19b and conductive patterns 17/18 as a whole constitute the inter-level connector 14b.

Figure 4E:
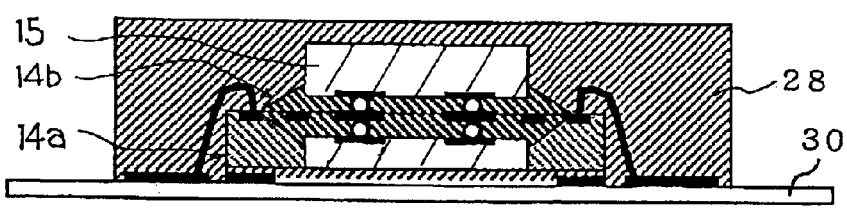

Subsequently, the resultant structure is conveyed to a transfer molding apparatus (not shown), and is sealed in the epoxy resin. The epoxy resin is thermally cured so that the semiconductor chip package 14a, inter-level connector 14b and semiconductor flip chip 15 are sealed in the synthetic resin package 28 as shown in FIG. 4E.

Figure 4F:
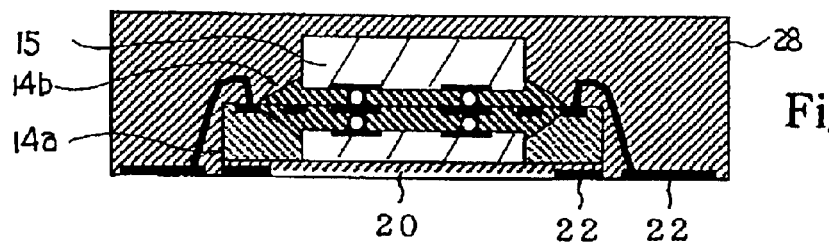

Subsequently, the frame 30 is removed by using a wet etching technique. Alkaline etchant is used in the wet etching so that the copper content is selectively removed. As a result, the conductive pattern 22 is exposed as shown in FIG. 4F.

Figure 4G:
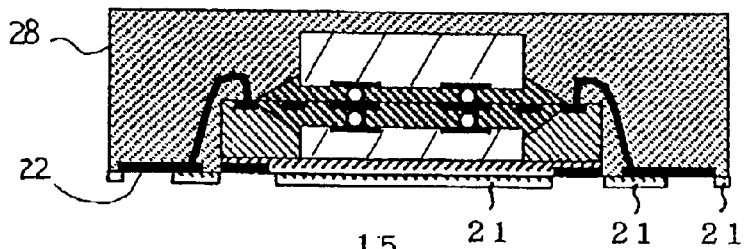
Figure 4H:
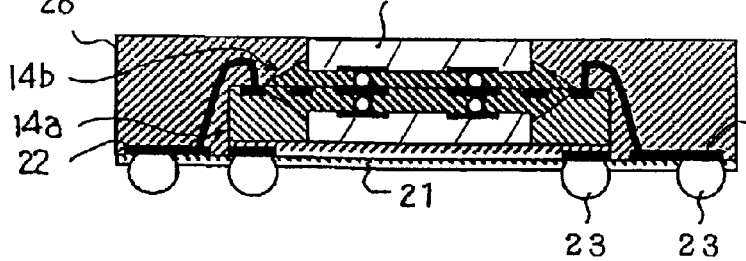

Subsequently, the solder resist layer 21 is formed on the reverse surface of the resultant structure. Thermally curable resin may be printed in the pattern. Thermally curable resin may be uniformly spread over the reverse surface, and via-holes may be formed in the thermally cured resin layer by using a laser light beam. The via-holes may be formed in a thermally curable tape before being adhered to the reverse surface. Otherwise, the via-holes may be formed in the thermally cured tape after being adhered to the reverse surface The conductive pattern 22 is partially exposed to the via-holes as shown in FIG. 4G.

Subsequently, the synthetic resin package 28 is partially polished so that the semiconductor flip chip 15 is exposed to the upper surface of the synthetic resin package 28. Solder balls are provided in the via-holes, and are reflowed so that the conductive balls 23 are secured to the conductive pattern 22 a shown in FIG. 4H. The solder balls may be replaced with solder paste. The stacked package semiconductor device 10 is separated from other stacked package semiconductor devices by using a dicing machine, and the stacked package semiconductor device 10 is completed.

In the above described process, the conductive patterns 16, 17, 18, 22 and 24 are formed from the gold layer, nickel layer, copper layer, nickel layer and gold layer. However, other combinations are available for the conductive patterns 16/17/18/22/24. The conductive patterns may consist of a gold layer, a palladium layer, nickel layer, a copper layer, a nickel layer, a palladium layer and a gold layer. One of the two palladium layers may be deleted from the conductive patterns. The gold layer is 0.01 micron thick to several microns thick, palladium layer is 0.01 micron thick to several microns thick, nickel layer is 1 micron thick to several microns thick, and copper layer is several microns thick to tends microns thick.

In the above-described process, the solder bumps are used as the conductive bumps 19a/19b. In another process, gold bumps may be employed in the inter-level connector 14b. The solder resist layer 21 may be formed from a sheet of polyimide layer with an adhesive compound layer instead of the thermally curable synthetic resin.

Moreover, the wire bonding (see FIG. 4C) may be carried out after the flip chip bonding between the semiconductor flip chip 15 and the semiconductor chip package 14a (see FIG. 4D). The polishing on the synthetic resin package 28, separation into the stacked package semiconductor devices and bonding step for the conductive balls 23 may be carried out in another order different from the order described hereinbefore.

As will be understood from the foregoing description, the synthetic resin package 28 is reduced in thickness through the polishing as similar to the semiconductor chip package 14a. This is because of the fact that the semiconductor flip chip 15 has been already sealed in the synthetic resin package 28. In other words, the semiconductor flip chip 15 well withstands the mechanical force during the polishing. Thus, the stacked package semiconductor device 10 according to the present invention is light and thin so that the manufacturer reduces the thickness and weight of portable electronic goods by using the stacked package semiconductor device 10 according to the present invention.

Second Embodiment

Figure 5:
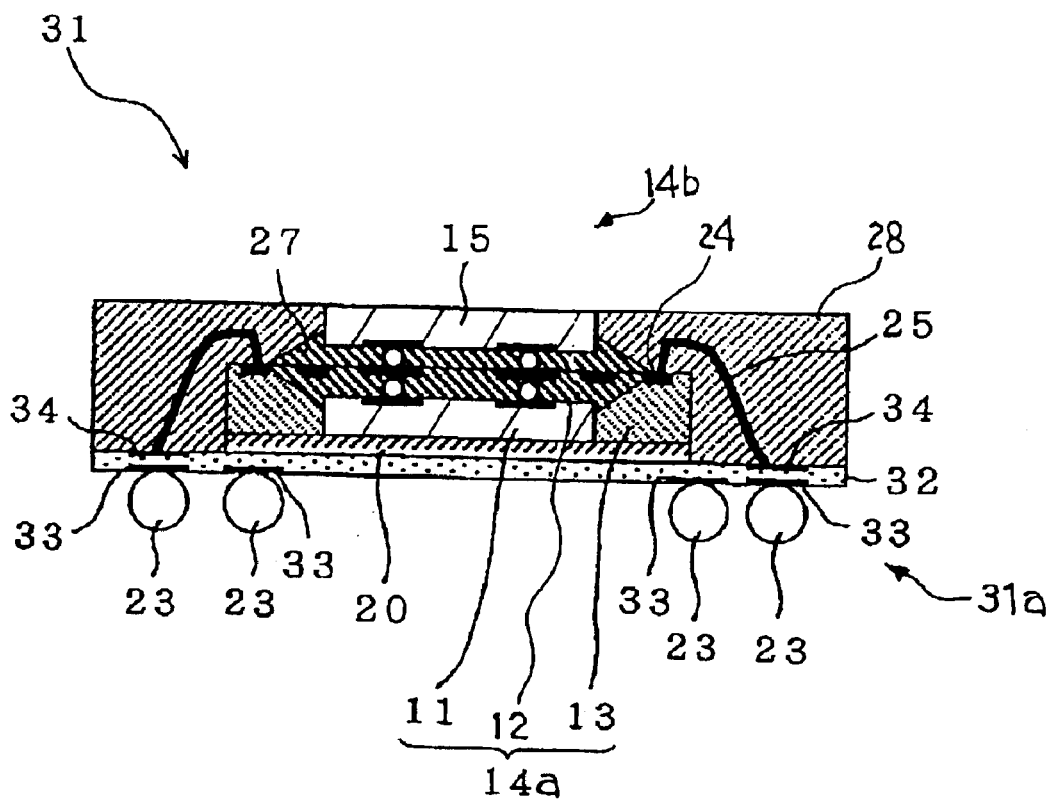
FIG. 5 is a cross sectional view showing the structure of another stacked package semiconductor device according to the present invention.

Turning to FIG. 5 of the drawings, another stacked package semiconductor device 31 also largely comprises the semiconductor chip package 14a, inter-level connector 14b, semiconductor flip chip 15, synthetic resin package 28 and a ball grid array 31a. The component parts 14a, 14b, 15 and 28 are similar to those of the first embodiment, and only the ball grid array 31a is different from the ball grid array 14c. For this reason, description is focused on the ball grid array 14c.

The ball grip array 31a includes an insulating substrate 32, conductive patterns 33/34 and conductive balls 23. Each of the conductive patterns 33/34 includes plural conductive strips. The conductive strips of the conductive pattern 33 are selectively connected to the conductive strips of the other conductive pattern 34. A printed rigid circuit board, a flexible printed film such as, for example, a TAB (Tape Automated Bonding) tape or a metal-core printed substrate is available for the insulating substrate 32. The insulating substrate 32 has two major surfaces. The semiconductor chip package 14a is mounted on a central area of one of the major surfaces by means of the adhesive compound layer 20, and the conductive pattern 34 is formed in the peripheral area of the major surface. The conductive pattern 34 is connected through the conductive wires 25 to the conductive pattern 24 of the semiconductor chip package 28. The conductive pattern 33 is formed on the other major surface of the insulating substrate 32, and the conductive balls 23 are bonded to the conductive pattern 33. Though not shown in FIG. 5, the conductive pattern 34 is connected to the conductive pattern 33 through an inter-level connecting pattern, and electric signals and electric powers are supplied from the conductive balls 23 to the semiconductor flip chips 11/15

The stacked package semiconductor device 31 is light and thin by virtue of the reduced thickness of the semiconductor chip package 14a and synthetic resin package 28 as similar to the first embodiment.

Third Embodiment

Figure 6:
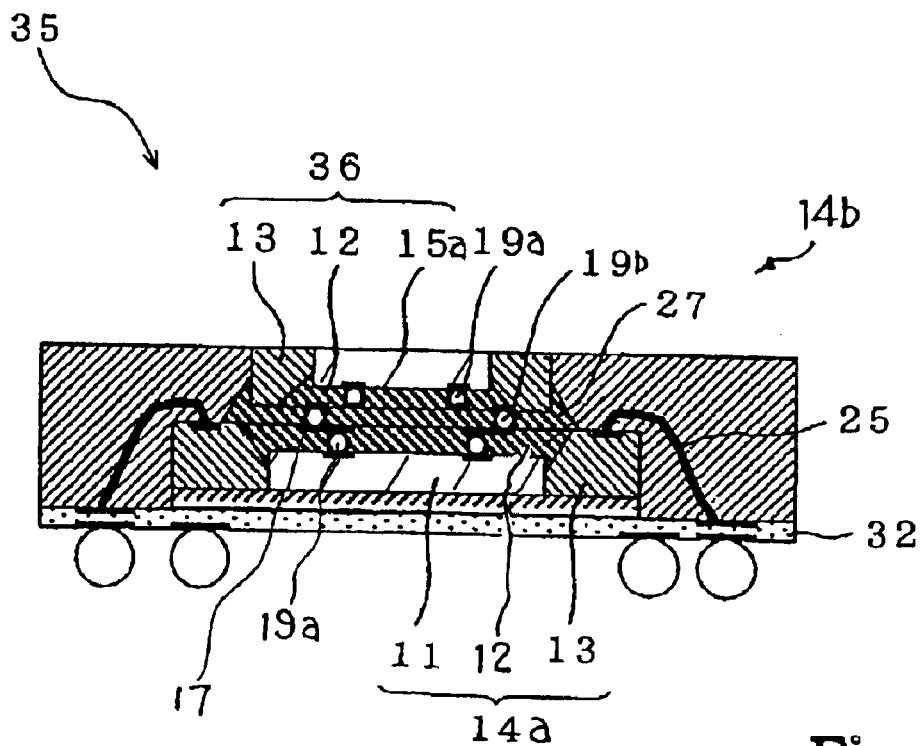
FIG. 6 is a cross sectional view showing the structure of yet another stacked package semiconductor device according to the present invention.

FIG. 6 shows yet another stacked package semiconductor device 35 embodying the present invention. In the stacked package semiconductor device 35, the semiconductor flip chip 15 is replaced with a semiconductor chip package 36. The semiconductor chip package 36 was fabricated as similar to the semiconductor chip package 14. The semiconductor chip package 14a is stacked with the semiconductor chip package 36, and the inter-level connector 14b offers the signal paths between the semiconductor chip packages 14a and 36.

The semiconductor chip package 36 includes a semiconductor flip chip 15a, a sealing package 13 and an unerfill resin layer 12, and conductive bumps 19b are embedded in the underfill resin layer 12 for electrically connecting the integrated circuit of the semiconductor flip chip 11 to the integrated circuit of the semiconductor flip chip 15a.

Since both semiconductor chip packages 14a/36 were reinforced with the sealing packages 13 and underfill resin layers 12, the manufacturer reduced the thickness of the semiconductor chip packages 14a/36 without breakage of the semiconductor flip chips 11/15a. Thus, the stacked package semiconductor device 35 is reduced in thickness, and is conducive to scale-down for portable electronic goods.

Fourth Embodiment

Figure 7:
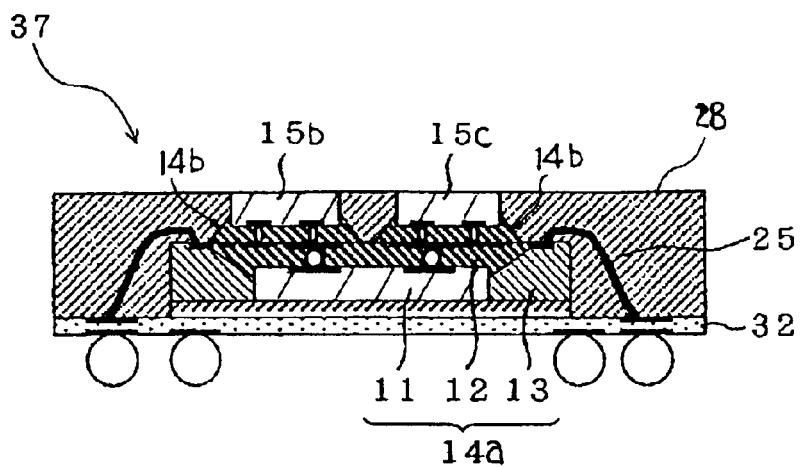
FIG. 7 is a cross sectional view showing the structure of still another stacked package semiconductor device according to the present invention.

FIG. 7 shows still another stacked package semiconductor device 37 embodying the present invention. A difference from the stacked package semiconductor device 10 is that the semiconductor flip chip package 14a is stacked with plural semiconductor chips 15b/15c. The semiconductor chips 15b/15c are arranged in parallel on the semiconductor chip package 14a, and inter-level connectors 14b offer signal paths between the integrated circuit of the semiconductor chip package 14a and integrated circuits of the plural semiconductor chips 15b/15c.

The semiconductor chip package 14a is reduced in thickness through the polishing, and the sealing package 13 and underfill resin layer 12 prevent the semiconductor flip chip 11 from breakage. The semiconductor flip chips 15b/15c were also reduced in thickness through the polishing without breakage, because the semiconductor flip chips 15b/15c had been already sealed in the synthetic resin package 28. The stacked package semiconductor device 37 is conducive to the scale-down for portable electronic goods.

Fifth Embodiment

Figure 8:
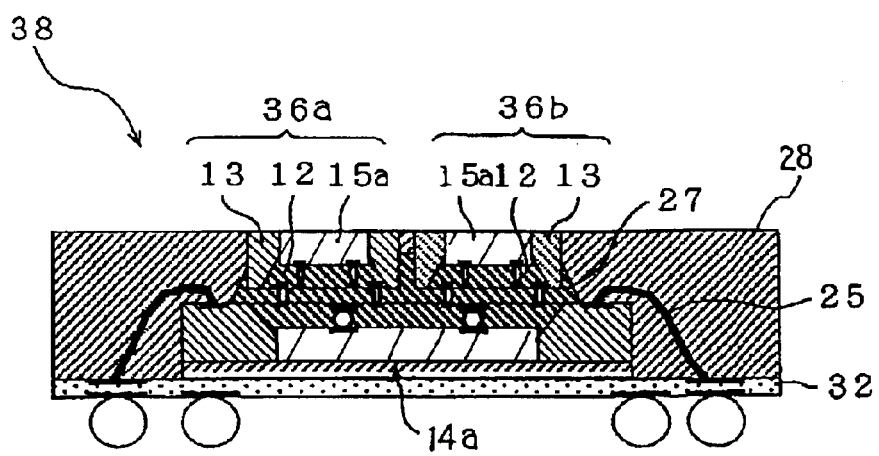
FIG. 8 is a cross sectional view showing the structure of yet another stacked package semiconductor device according to the present invention.

FIG. 8 shows yet another stacked package semiconductor device 38 embodying the present invention. The stacked package semiconductor device 38 is different from the stacked package semiconductor device 37 in that the semiconductor flip chips 15b/15c are replaced with semiconductor chip packages 36a/36b. The semiconductor chip package 36a/36b are similar in structure to the semiconductor chip package 36, and no further description is hereinafter incorporated for the sake of simplicity.

The semiconductor chip packages 14a/36a/36b are reduced in thickness through the polishing so that the stacked package semiconductor device 38 is light and thin. Thus, the stacked package semiconductor device 38 is conducive to the scale-down for the portable electronic goods.

Sixth Embodiment

Figure 9:
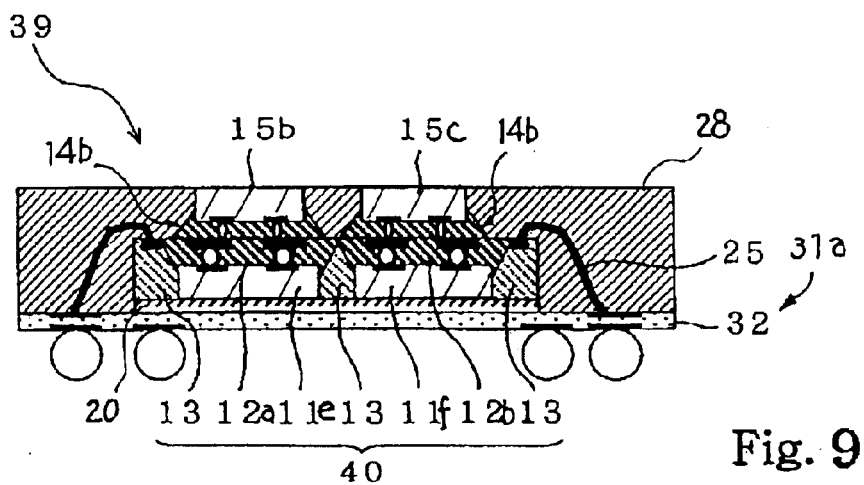
FIG. 9 is a cross sectional view showing the structure of still another stacked package semiconductor device according to the present invention.

FIG. 9 shows still another stacked package semiconductor device 39 embodying the present invention. The stacked package semiconductor device 39 is different from the stacked package semiconductor device 37 in that the semiconductor chip package 14a is replaced with a semiconductor chip package 40.

The semiconductor chip package 40 includes plural semiconductor flip chips 11e/11f, plural underfill layers/conductive patterns/conductive bumps 12a/12b and a sealing package 13. The semiconductor flip chips 11e/11f are arranged in parallel in the sealing package 13, and plural recesses are formed in the sealing package 13. The underfill resin layers/conductive patterns/conductive bumps 12a/12b fill the recesses, respectively. The plural inter-level connectors 14b are provided between the semiconductor chip package 40 and the semiconductor flip chips 15b/15c, and selectively connect the integrated circuits of the semiconductor flip chips 11e/11f to the integrated circuits of the semiconductor flip chips 15b/15c.

The semiconductor chip package 40 was reduced in thickness through the polishing so that the semiconductor flip chips 11e/11f are exposed to the adhesive compound layer 20. The synthetic resin package 28 was also polished so that the semiconductor chip 15b/15c are exposed to the outside of the synthetic resin package 28. Thus, the stacked package semiconductor device 39 is light and thin so that the manufacturer can scale down portable electronic goods by virtue of the stacked package semiconductor device 39.

Figure 10A:
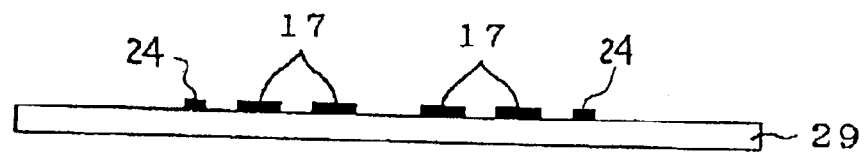
FIGS. 10A to 10F are cross sectional views showing a process for fabricating a semiconductor chip package used in the sacked package semiconductor device.
Figure 10B:
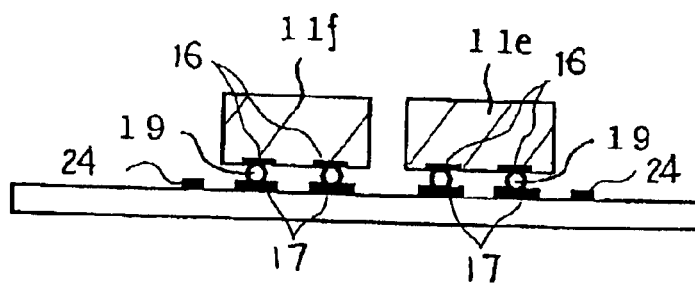

The semiconductor chip package 40 is fabricated as follows. First, a copper substrate 29 is prepared. The conductive patterns 17/24 are patterned on the major surface of the copper substrate 29 as shown in FIG. 10A. Subsequently, the semiconductor flip chips 11e/11f are mounted on the copper substrate 29 through the flip chip bonding techniques, and the conductive bumps 19 electrically connect the conductive pads 16 on the semiconductor flip chips 11e/11f to the conductive patterns 17 as shown in FIG. 10B.

Figure 10C:
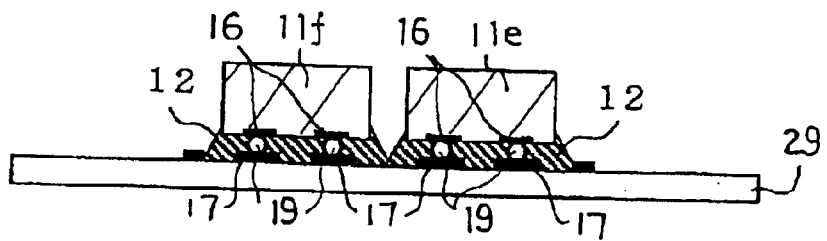

The synthetic resin is injected into the gaps between the copper substrate 29 and the semiconductor flip chips 11e/11f, and are spread around the semiconductor flip chips 11e/11f. The synthetic resin is thermally cured so that the conductive bumps 19 are embedded in the underfill resin layers 12 as shown in FIG. 10C. The underfill resin layers 12 fixes the relative positions between the conductive patterns 17 and the conductive pads 16, and reinforce the semiconductor flip chips 11e/11f.

Figure 10D:
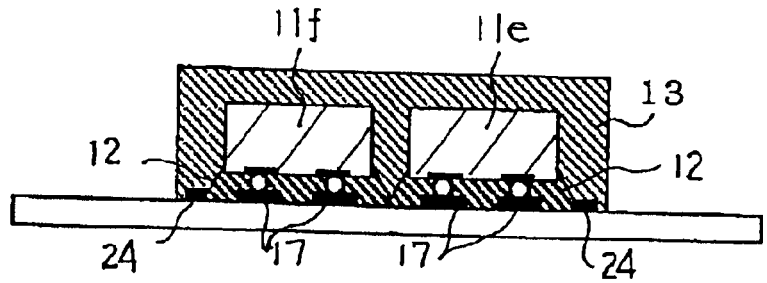

Subsequently, the resultant structure is put in a molding die (not shown), and epoxy resin is injected into the molding die. The epoxy resin is thermally cured so that the semiconductor flip chips 11e/11f, underfill resin layers 12 and conductive patterns 17/24 are sealed in the sealing package 13 as shown in FIG. 10D.

Figure 10E:
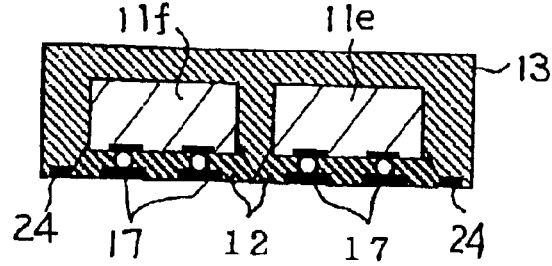
Figure 10F:
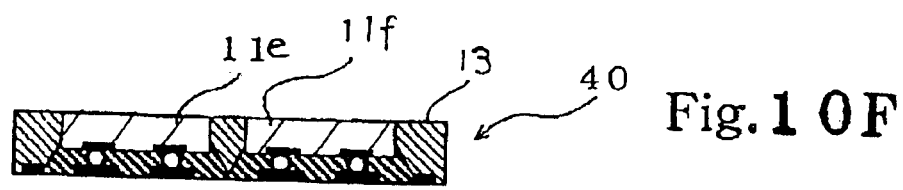

Subsequently, the copper substrate 29 is etched away so that the conductive patterns 17/24 are exposed as shown in FIG. 10E. The sealing package 13 and part of the semiconductor flip chips 11e/11f are polished so that the semiconductor flip chips 11e/11f are exposed as shown in FIG. 10F.

Finally, the semiconductor chip package 40 is separated from other semiconductor chip packages concurrently sealed in the sealing package. Thus, the semiconductor flip chips 11e/11f are reinforced with the sealing package 13 and underfill resin layers 12. For this reason, the semiconductor chip package 40 is reduced in thickness through the polishing without breakage.

Seventh Embodiment

Figure 11:
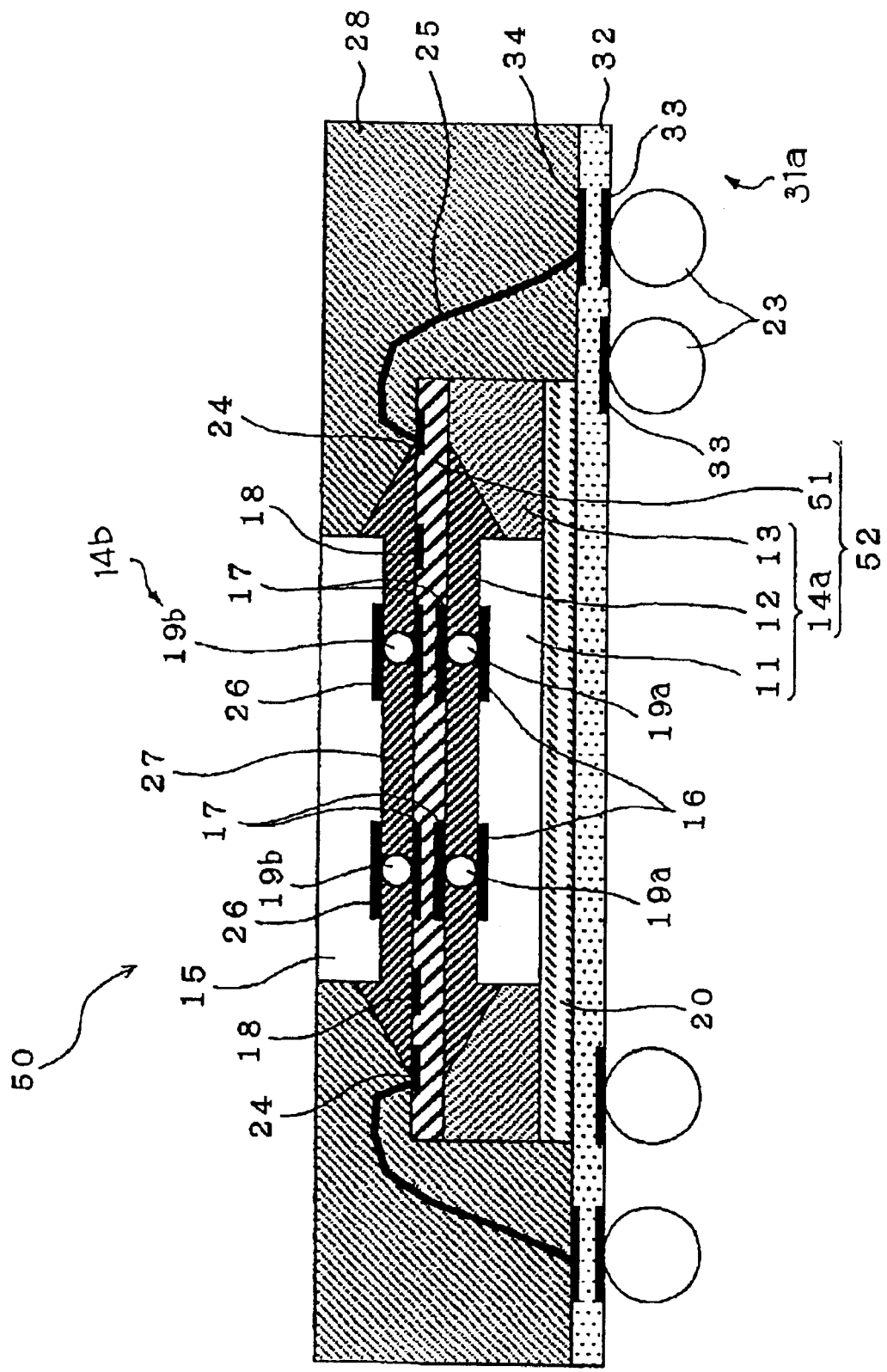
FIG. 11 is a cross sectional view showing the structure of yet another stacked package semiconductor device according to the present invention.

FIG. 11 shows yet another stacked package semiconductor device 50 embodying the present invention. The stacked package semiconductor device 50 is different from the stacked package semiconductor device 10 in that the semiconductor chip package 14a and an interposer form in combination a semiconductor package 52 and in that the ball grid array 14c is replaced with the ball grid array 31a.

The conductive patterns 17/18/24 are formed on the major surfaces of the interposer 51, and the semiconductor chip package 14a is assembled with the interposer 51 through the flip chip bonding technique. A rigid printed board, a flexible printed tape or a lead-frame serves as the interposer 51. The conductive pattern 17 on the lower major surface is aligned with the conductive pads 16 of the semiconductor flip chip 11, and the conductive bumps 19a, which are embedded in the underfill resin layer 12, are connected between the conductive pads 16 and the conductive pattern 17. The conductive pattern 17 on the lower major surface is electrically connected to the conductive pattern 17 on the upper major surface. The conductive pads 26 are aligned with the conductive pattern 17 on the upper major surface, and the conductive bumps 19b, which are embedded in the underfill resin layer 27, are connected between the conductive pattern and the conductive bumps 26. Thus, the conductive patterns 17 of the interposer 51 connect the conductive bumps 19a of the semiconductor chip package 14a to the conductive bumps 19b of the inter-level connector 14b.

The underfill resin layers 12/27 are held in contact with the major surfaces of the interposer 51 so that the semiconductor package 52 is stacked with the semiconductor flip chip 15 by means of the inter-level connector 14b. The conductive pattern 24 is connected to the conductive pattern 34 of the ball grid array 31a by means of the conductive wires 25. The ball grid array 31a is similar in structure to that of the stacked package semiconductor device 31, and no further description is hereinafter incorporated for the sake of simplicity.

The semiconductor package 52 is fabricated as follows. First, the semiconductor package 52 is fabricated through a process sequence shown in FIGS. 12A to 12E. The conductive patterns 17/18/24 are formed on the major surfaces of an insulating substrate, and the interposer 51 is obtained as shown in FIG. 12A. The conductive pads 16 are aligned with the conductive pattern 17, and a semiconductor flip chip 62 is mounted on the interposer 51 by means of the conductive bumps 19 as shown in FIG. 12B. Although the interposer 51 is shared with other semiconductor flip chips 62, only one semiconductor flip chip 62 is shown in the figures.

Subsequently, synthetic resin is injected into the gap between the interposer 51 and the semiconductor flip chip 62, and is spread around the semiconductor flip chip 62. The synthetic resin is thermally cured so that the underfill resin layer 12 fixes the semiconductor flip chip 62 to the interposer 51 as shown in FIG. 12C. The resultant structure is put in a molding die (not shown), and epoxy resin is injected into the molding die. The epoxy resin is thermally cured so that the semiconductor flip chip 62 and underfill resin layer 12 are sealed in the sealing package 13 as shown in FIG. 12D.

Subsequently, the sealing package 13 and semiconductor flip chip 62 are polished so that the remaining semiconductor flip chip 11 is exposed to the outside of the sealing package 13 as shown in FIG. 12E. Finally, the resultant structure is separated into the semiconductor packages 52, and one of the semiconductor packages 52 is shown.

Figure 13A:
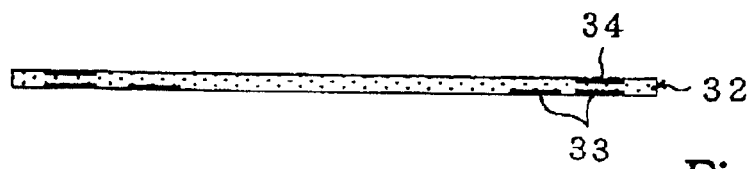
FIGS. 13A to 13F are cross sectional views showing a process for fabricating the stacked package semiconductor device.

The semiconductor package 52 and other component parts are assembled into the stacked package semiconductor device 50 through a process sequence shown in FIGS. 13A to 13F. The process starts with preparation of the insulating substrate 32. The conductive patterns 33 and 34 are formed on the major surfaces of the insulating substrate 32 as shown in FIG. 13A. The conductive pattern 34 is electrically connected to the conductive pattern 33. Although plural semiconductor packages 52 are concurrently mounted on the substrate 32, only one semiconductor package 52 is shown and described hereinafter.

Figure 13B:
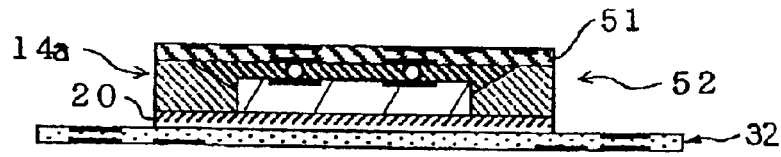

Subsequently, the semiconductor package 52 is turned back, and, thereafter, is mounted on the substrate 52, and the adhesive compound layer 20 is sandwiched between the semiconductor package 52 and the substrate 32. The adhesive compound layer 20 is thermally cured so that the semiconductor package 52 is fixed to the substrate 32 as shown in FIG. 13B.

Figure 13C:
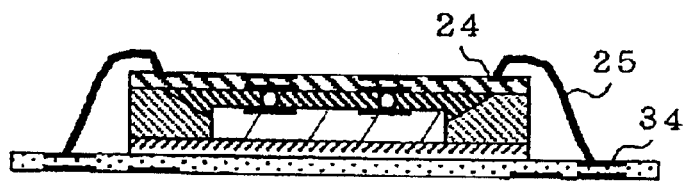

Subsequently, the conductive wires 25 are bonded between the conductive pattern 24 and the conductive pattern 34 by using the wire bonding technique as shown in FIG. 13C.

Figure 13D:
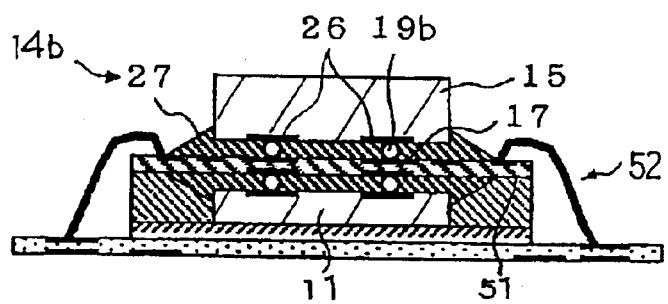

Subsequently, the conductive pads 26 of the semiconductor flip chip 15 are aligned with the conductive pattern 17, and are electrically connected to the conductive pattern 17 by means of the conductive bumps 19b. Thus, the integrated circuit of the semiconductor chip 11 is electrically connected through the interposer 51 and inter-level connector 14b to the integrated circuit of the semiconductor flip chip 15. The synthetic resin is injected into the gap between the interposer 51 and the semiconductor flip chip 15, and is spread around the semiconductor flip chip 15. The synthetic resin is thermally cured so that the underfill resin layer 27 fixes the semiconductor flip chip 15 to the interposer 51 as shown in FIG. 13D. The injection of the synthetic resin and thermal curing may be carried out before the flip chip bonding between the interposer 51 and the semiconductor flip chip 15.

Figure 13E:
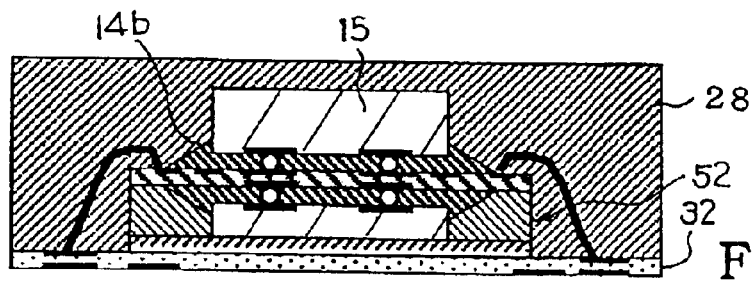

Subsequently, the resultant structure is put in a transfer molding die (not shown), and epoxy resin is injected into the transfer molding die. The epoxy resin is thermally cured so that the semiconductor package 52, semiconductor flip chip 15 and inter-level connector 14b are sealed in the synthetic resin package 28 as shown in FIG. 13E.

Figure 13F:
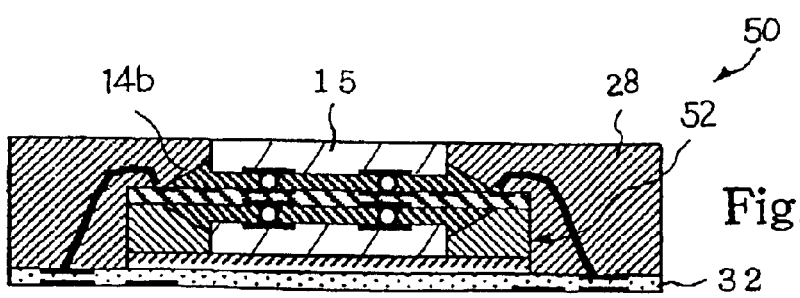

The synthetic resin package 28 and semiconductor flip chip 15 are polished so that the semiconductor flip chip 15 is exposed to the outside s shown in FIG. 13F. Finally, the conductive balls 23 are bonded to the conductive pattern 33, and the resultant structure is separated into the stacked package semiconductor devices 50.

The wire bonding (see FIG. 13C) may be carried out after the flip chip mounting (see FIG. 13D), and the polishing, separation and bonding step for the conductive balls 23 may be carried out in a different order.

As will be understood, the semiconductor package 52 is reduced in thickness through the polishing (see FIG. 12E), and the stacked package semiconductor device 50 is further reduced in thickness through the polishing (see FIG. 13F). The semiconductor package 52 was reinforced with the sealing package 13 and underfill resin layer 12 so that the semiconductor flip chip 62 withstands the mechanical force during the polishing. Similarly, the semiconductor flip chip 15 is reinforced with the synthetic resin package 28 so that the semiconductor flip chip 15 withstands the mechanical force during the polishing.

Eighth Embodiment

Figure 14:
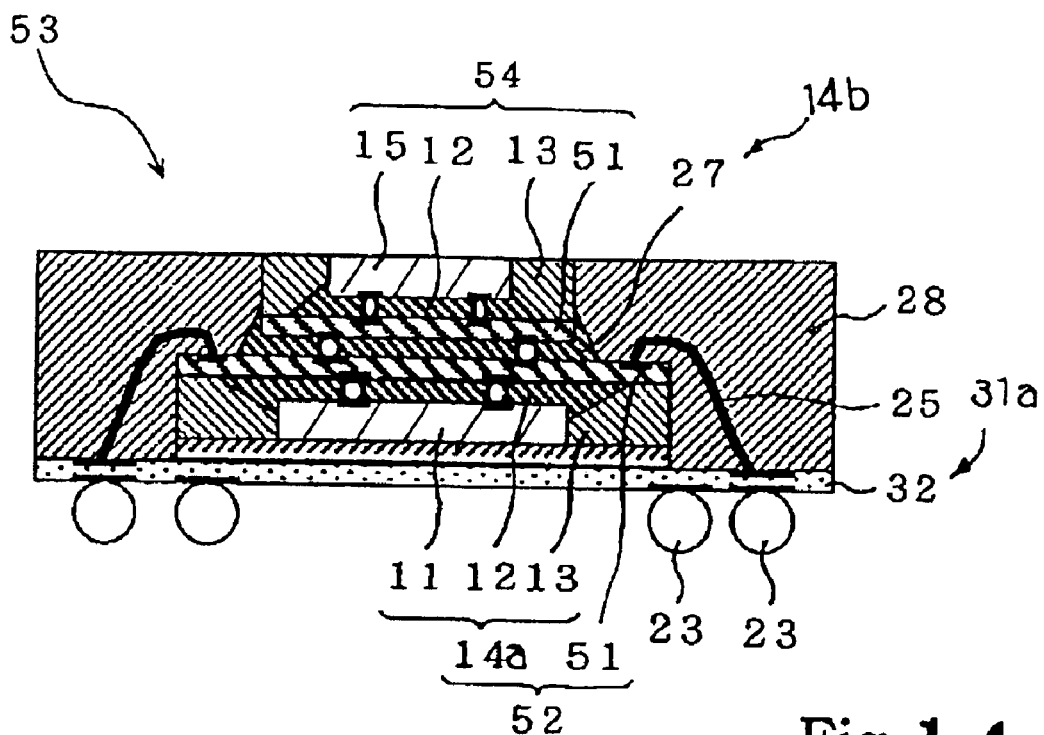
FIG. 14 is a cross sectional view showing the structure of still another stacked package semiconductor device according to the present invention.

FIG. 14 shows still another stacked package semiconductor device 53 embodying the present invention. The stacked package semiconductor device 53 is different from the stacked package semiconductor device 50 in that the semiconductor flip chip 15 is replaced with a semiconductor package 54. Although the semiconductor flip chip 15 is incorporated in the semiconductor package 54, the other features of the semiconductor package 54 are similar to the semiconductor package 52, and description on the semiconductor package 54 is omitted for the sake of simplicity.

The semiconductor package 54 is turned back, and is connected to the interposer 51 through the flip chip bonding technique. The underfill resin layer 27 fixes the semiconductor package 54 to the interposer 51, and the inter-level connector 14b electrically connects the integrated circuit of the semiconductor flip chip 11 to the integrated circuit of the semiconductor flip chip 15.

Although the semiconductor packages 52/54 are reduced in thickness through the polishing, the sealing packages 13 and underfill resin layers 12/27 reinforce the semiconductor flip chips 11/15, and prevent the semiconductor flip chips 11/15 from breakage during the polishing. The stacked package semiconductor device 53 is light and thin, and the manufacturer can scale down portable electronic goods by virtue of the stacked package semiconductor device 53.

Ninth Embodiment

Figure 15:
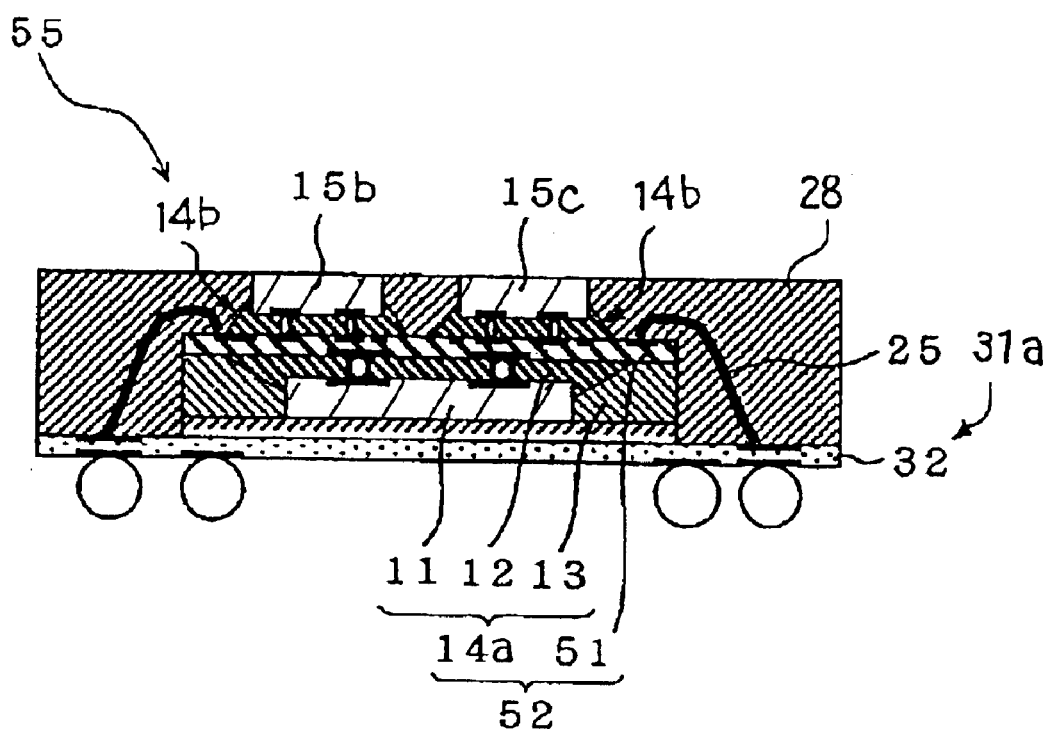
FIG. 15 is a cross sectional view showing the structure of yet another stacked package semiconductor device according to the present invention.

FIG. 15 shows yet another stacked package semiconductor device 55 embodying the present invention. The stacked package semiconductor device 55 is different from the stacked package semiconductor device 50 in that the semiconductor package 52 is stacked with plural semiconductor flip chips 15b/15c. The semiconductor flip chips 15b/15c are arranged in parallel over the semiconductor package 52, and the inter-level connectors 14b electrically connect the integrated circuit of the semiconductor package 52 to the integrated circuits of the semiconductor flip chips 15b/15c.

Although the semiconductor package 52 and semiconductor flip chips 15b/15c are reduced in thickness through the polishing, the sealing package 13, synthetic resin package 28 and underfill resin layers 12/27 reinforce the semiconductor flip chips 11/15b/15c, and prevent the semiconductor flip chips 11/15b/15c from breakage during the polishing. The stacked package semiconductor device 55 is light and thin, and the manufacturer can scale down portable electronic goods by virtue of the stacked package semiconductor device 55.

Tenth Embodiment

Figure 16:
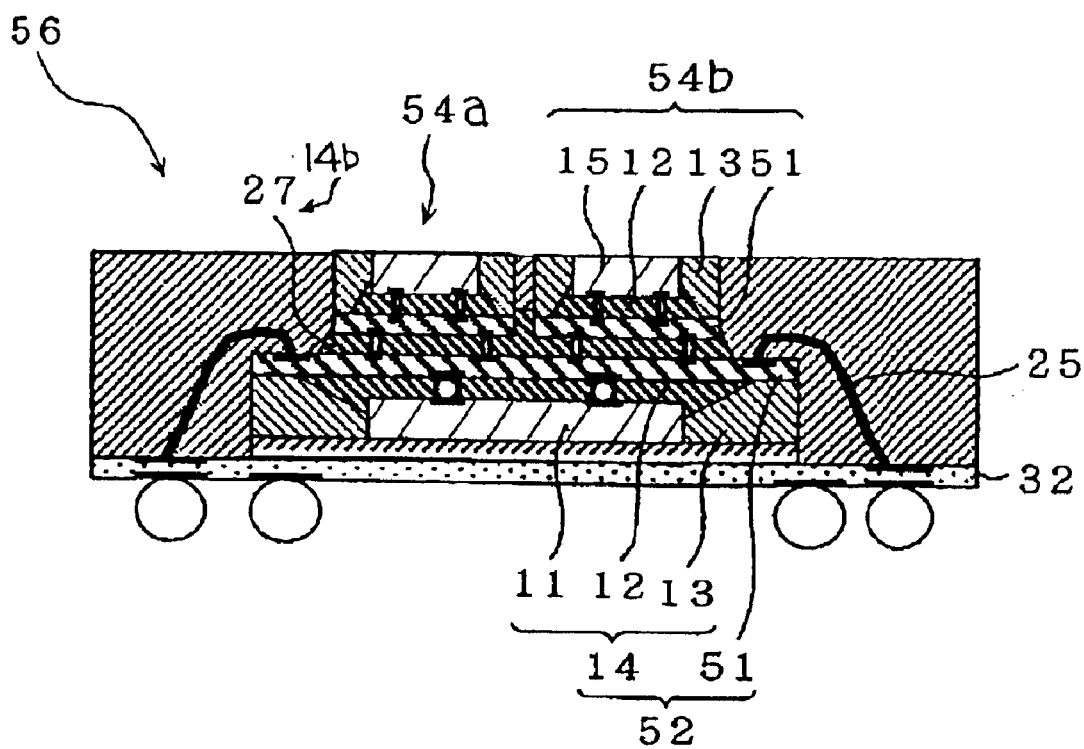
FIG. 16 is a cross sectional view showing the structure of still another stacked package semiconductor device according to the present invention.

FIG. 16 shows still another stacked package semiconductor device 56 embodying the present invention. The stacked package semiconductor device 56 is different from the stacked package semiconductor device 55 in that the semiconductor flip chips 15b/15c are replaced with semiconductor packages 54a/54b. Although the semiconductor flip chips 15 are incorporated in the semiconductor packages 54a/54b, the other features of the semiconductor packages 54a/54b are similar to the semiconductor package 52, and description on the semiconductor packages 54a/54b is omitted for the sake of simplicity.

The semiconductor packages 54a/54b are turned back, and are connected to the interposer 51 through the flip chip bonding technique. The underfill resin layer 27 fixes the semiconductor packages 54a/54b to the interposer 51, and the inter-level connector 14b electrically connects the integrated circuit of the semiconductor flip chip 11 to the integrated circuits of the semiconductor flip chips 15.

Although the semiconductor packages 52/54a/54b are reduced in thickness through the polishing, the sealing packages 13 and underfill resin layers 12/27 reinforce the semiconductor flip chips 11/15, and prevent the semiconductor flip chips 11/15 from breakage during the polishing. The stacked package semiconductor device 56 is light and thin, and the manufacturer can scale down portable electronic goods by virtue of the stacked package semiconductor device 56.

Eleventh Embodiment

Figure 17:
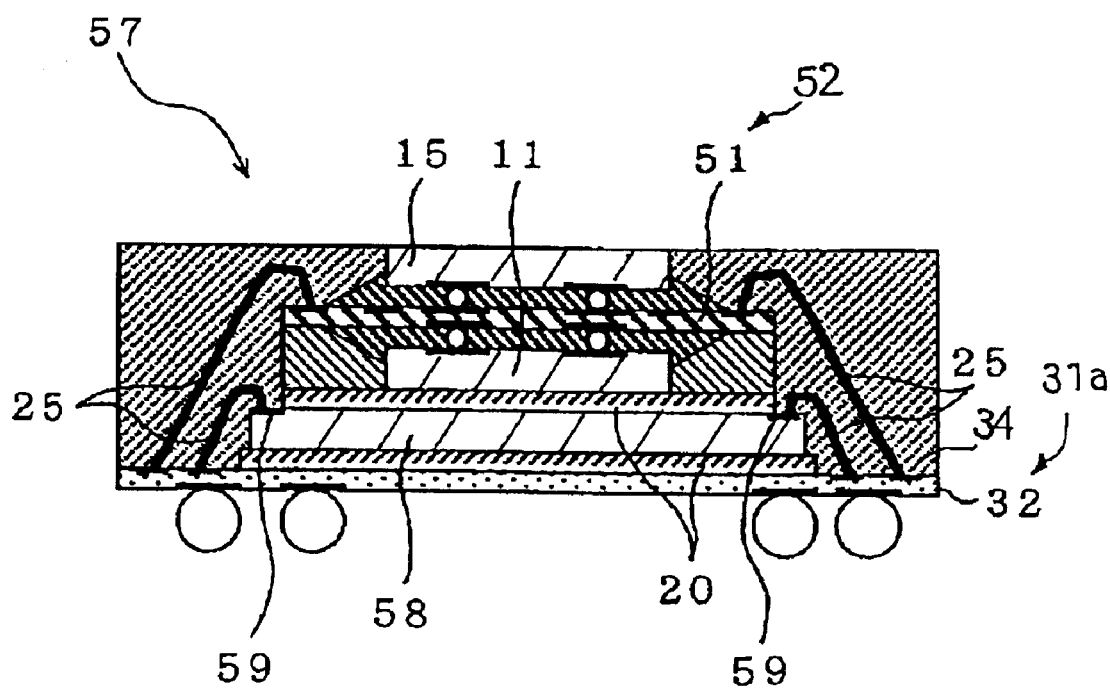
FIG. 17 is a cross sectional view showing the structure of yet another stacked package semiconductor device according to the present invention.

FIG. 17 shows yet another stacked package semiconductor device 57 embodying the present invention. The stacked package semiconductor device 57 is different from the stacked package semiconductor device 50 in that a semiconductor chip 58 is inserted into the ball grid array 31a and the semiconductor package 52. The conductive pads 59 of the semiconductor chip 58 is connected to the conductive pattern 34 through the conductive wires 25, and is bonded to the substrate 32 by means of an adhesive compound layer 20.

The stacked package semiconductor device 57 achieves all the advantages of the stacked package semiconductor device 50.

Twelfth Embodiment

Figure 18:
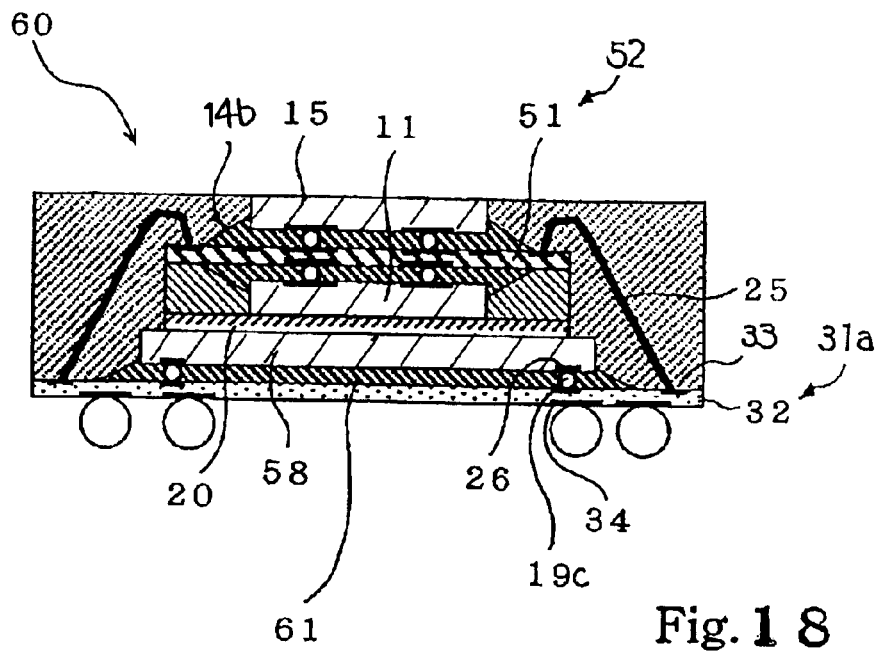
FIG. 18 is a cross sectional view showing the structure of still another stacked package semiconductor device according to the present invention.
Figure 1:
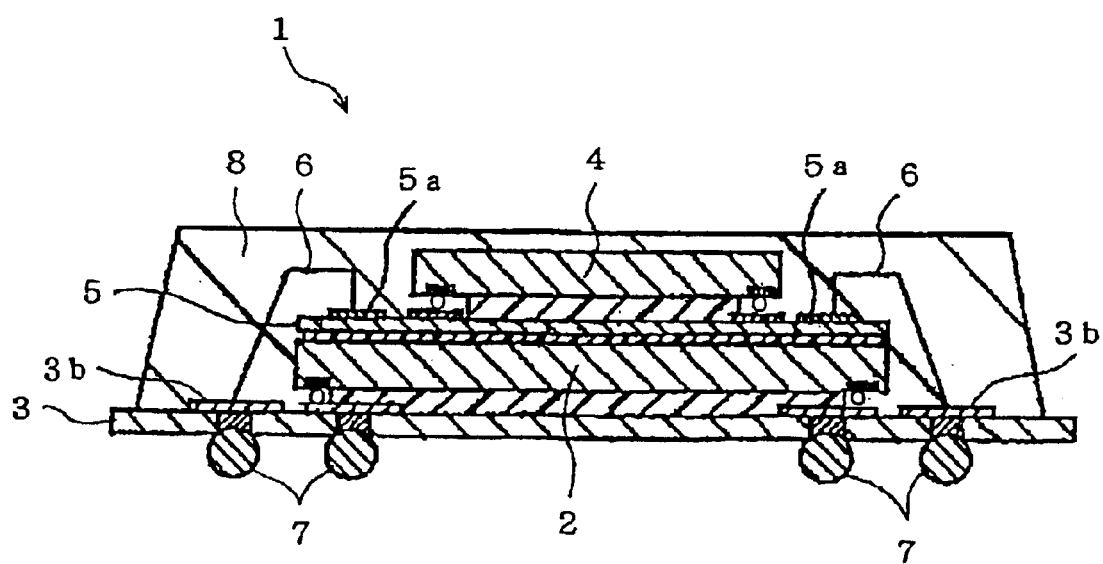
FIG. 1 is a cross sectional view showing the structure of the prior art stacked package semiconductor device.

FIG. 18 shows still another stacked package semiconductor device 60 embodying the present invention. The stacked package semiconductor device 60 is different from the stacked package semiconductor device 57 in that the semiconductor chip 58 is mounted on the substrate 32 by using the flip chip bonding technique. For this reason, conductive bumps 19c are provided between the conductive pads 26 of the semiconductor chip 58 and the conductive pattern 33, and an underfill resin layer 61 fixes the semiconductor chip 58 to the substrate 32. The stacked package semiconductor device 60 achieves all the advantages of the stacked package semiconductor device 50.

As will be understood, the interposer 51 is incorporated in the semiconductor package 52 or packages 52/54, 52/54a/54b, and are sealed in the sealing package 13 or sealing packages 13 so that the manufacturer can reduce the thickness through the polishing or grinding. The semiconductor package 52 is stacked with other semiconductor flip chip 15 or chips 15b/15c, and the resultant structure is sealed in the synthetic resin package 28. The semiconductor flip chip 15 or chips 15b/15c are also reduced in thickness without breakage of the semiconductor flip chips by virtue of the synthetic resin package 28.

The inter-level connector 14b, interposer 51 and conductive wires 25 are selectively employed in the stacked package semiconductor devices 10/31/35/37/38/39/50/53/55/56/57/60, and the electric signals and electric powers are selectively supplied to the integrated circuits of the semiconductor flip chips.

As will be appreciated from the foregoing description, the semiconductor flip chips have been reinforced with the sealing packages/synthetic resin packages and underfill resin layers. Although the semiconductor flip chips were polished or ground for reducing the thickness, the packages and underfill resin layers prevented the semiconductor flip chips from breakage. Thus, the manufacturer decreased the thickness of the semiconductor flip chips without reduction in the production yield. This results in the light thin stacked package semiconductor devices.

Especially, the stacked package semiconductor devices 10, 31, 35, 37, 38 and 39 have the semiconductor chip packages 14a/40 connected to the semiconductor chip package 36/36a/36b or flip chip 15/15b/15c through the flip chip bonding technique. This means that any substrate is not required for the other semiconductor chip package and flip chip. This results in the extremely thin stacked package semiconductor devices. The semiconductor chip packages 14a/40/36/36a/36b are fallen within the range from 10 microns thick to 150 microns thick. Even if the semiconductor chip package 14a/40 is stacked with the semiconductor chip packages 36/36a/36b, the total thickness does not exceed 400 microns. Thus, the stacked package semiconductor devices according to the present invention is light and thin.

The conductive wires 25 are directly connected to the conductive pattern 24 directly formed on the semiconductor chip package. Any substrate is not required for the semiconductor chip packages.

The inter-level connector 14b permits the manufacturer to stack the semiconductor chip package 14a/40 with any semiconductor flip chip/semiconductor chip package differently designed. Thus, the inter-level connector 14b enhances the design flexibility.

The conductive pattern 18 for testing is desirable from the viewpoint of the production yield. The manufacturer can test the semiconductor chip package or semiconductor package through the conductive pattern 18. Even though the stacked package semiconductor devices are to be integrated into a multi-chip package, the semiconductor chip packages/semiconductor packages are individually diagnosed before the packaging. This results in enhancement of the production yield on the multi-chip packages.

Although particular embodiments of the present invention have been shown and described, it will be apparent to those skilled in the art that various changes and modifications may be made without departing from the spirit and scope of the present invention.

The inter-level connector, i.e., the conductive bumps embedded in the underfill resin layer are available for the connection between the packages and between the package and external terminals.

In the above-described embodiments, the semiconductor chip package 14a, semiconductor chip package 40 or semiconductor package 52 is corresponding to a semiconductor chip package in claims, and the semiconductor flip chip 15, flip chips 15b/15c, semiconductor chip package 36, packages 36a/36b, semiconductor chip package 54 or packages 54a/54b serve as a semiconductor element. The conductive bumps 19b as a whole constitute a connector buried in a piece synthetic resin.

What is claimed is:

1. A stacked package semiconductor device comprising:
   a semiconductor chip package including a sealing package made of a certain material and a semiconductor chip made or a semiconductor material brittler than said certain material, provided with a first group of conductive pads on a first surface thereof, sealed in said sealing package and having a second surface reverse to said first surface and exposed to the outside of said sealing package;
   a semiconductor element provided over said semiconductor chip and having a second group of conductive pads on a certain surface thereof;
   a connector electrically connected between certain conductive pads selected from said first group and corresponding conductive pads of said second group, and buried in a piece of synthetic resin held in contact with said semiconductor chip package and said semiconductor element;
   a package in which said semiconductor chip package, said semiconductor element and said connector are sealed; and
   an array of external terminals electrically connected to remaining conductive pads of said first group and remaining conductive pads of said second group.

2. The stacked package semiconductor device as set forth in claim 1, in which said package permits another surface of said semiconductor element reverse to said certain surface to be exposed to the outside thereof.

3. The stacked package semiconductor device as set forth in claim 2, in which said semiconductor element is a semiconductor flip chip.

4. The stacked package semiconductor device as set forth in claim 3, in which said semiconductor flip chip has a semiconductor substrate brittler than a material of said package.

5. The stacked package semiconductor device as set forth in claim 3, further comprising another semiconductor flip chip provided over said semiconductor chip package, and having conductive pads of a third group on a certain surface thereof and electrically connected through said connector to other certain conductive pads of said first group and another surface reverse of said certain surface and exposed to the outside of said package.

6. The stacked package semiconductor device as set forth in claim 2, in which said semiconductor element is another semiconductor chip package similar in structure to said semiconductor chip package.

7. The stacked package semiconductor device as set forth in claim 6, further comprising yet another semiconductor chip package provided over said semiconductor chip package, and having conductive pads of a third group electrically connected through said connector to other certain conductive pads of said first group.

8. The stacked package semiconductor device as set forth in claim 1, in which said semiconductor chip package further includes
   another piece of synthetic resin filling a recess formed in said sealing package in such a manner that said conductive pads of said first group are exposed thereto,
   a first conductive pattern formed on an outer surface of said another piece of synthetic resin and connected to said connector, and
   first conductive pieces connected between said certain conductive pads of said first group and said first conductive pattern, and buried in said another piece of synthetic resin.

9. The stacked package semiconductor device as set forth in claim 8, in which said semiconductor chip package further includes another semiconductor chip sealed in said sealing package and having a third group of conductive pads selectively connected to said connector and said array of external terminals.

10. The stacked package semiconductor device as set forth in claim 8, in which said semiconductor chip package further includes a second conductive pattern formed on said outer surface of said another piece of synthetic resin and selectively connected to said conductive pads of said first group for testing.

11. The stacked package semiconductor device as set forth in claim 1, in which said array of external terminals includes
   an insulating substrate having a first major surface held in contact with said package and a second major surface exposed to the outside of said package,
   a conductive pattern formed on said first major surface and electrically connected to said remaining conductive pads of said first group and said remaining conductive pads of said second group, and
   conductive pieces formed on said second major surface and electrically connected to said conductive pattern.

12. The slacked package semiconductor device as set forth in claim 11, in which said conductive pattern is connected through conductive wires to said remaining conductive pads of said first group and said remaining conductive pads of said second group.

13. The stacked package semiconductor device as set forth in claim 10, in which said conductive pieces are spherical.

14. The stacked package semiconductor device as set forth in claim 13, in which said conductive pieces are solder balls.

15. The stacked package semiconductor device as set forth in claim 1, in which said certain material is synthetic resin.

16. A semiconductor stacked package device comprising:

a semiconductor chip package including a sealing package formed with a hollow space, a semiconductor chip sealed in said scaling package and having conductive pads of a first group on a first surface exposed to said hollow space, and a connector formed in said hollow space and having a conductive pattern exposed to the outside of said sealing package and conductive pieces selectively connected between said conductive pads of said first group and said conductive pattern;

a semiconductor element stacked on said semiconductor chip package and having conductive pads of a second group selectively electrically connected to said conductive pattern by means of other conductive pieces;

an array of external terminals selectively electrically connected to said conductive pads of said first group and said conductive pads of said second group; and a synthetic resin package in which said semiconductor chip package and said semiconductor element are sealed, said array of external terminals being exposed to the outside of said synthetic resin package.

17. The semiconductor stacked package device as set forth in claim 16, in which said connector further includes a piece of synthetic resin in which said conductive pieces are buried.

18. The semiconductor stacked package device as set forth in claim 17, in which said piece of synthetic resin is adhered to another piece of synthetic resin in which said other conductive pieces are buried in such a manner as to connect said conductive pads of said second group to said conductive pattern.

* * * * *